(12) United States Patent
Kim et al.

(10) Patent No.: US 10,068,855 B2
(45) Date of Patent: Sep. 4, 2018

(54) SEMICONDUCTOR PACKAGE, METHOD OF MANUFACTURING THE SAME, AND ELECTRONIC DEVICE MODULE

(71) Applicant: Samsung Electro-Mechanics Co., Ltd., Suwon-si (KR)

(72) Inventors: Tae Hyun Kim, Suwon-si (KR); Thomas A. Kim, Suwon-si (KR); Kyu Bum Han, Suwon-si (KR); Kwan Hoo Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/598,497

(22) Filed: May 18, 2017

(65) Prior Publication Data

US 2018/0076147 A1 Mar. 15, 2018

(30) Foreign Application Priority Data

Sep. 12, 2016 (KR) .................. 10-2016-0117253
Feb. 27, 2017 (KR) .................. 10-2017-0025308

(51) Int. Cl.
*H01L 23/552* (2006.01)
*H01L 25/065* (2006.01)

(52) U.S. Cl.
CPC ........ *H01L 23/552* (2013.01); *H01L 25/0655* (2013.01); *H01L 25/0657* (2013.01); *H01L 2225/0651* (2013.01); *H01L 2225/06513* (2013.01); *H01L 2225/06586* (2013.01); *H01L 2225/06589* (2013.01)

(58) Field of Classification Search
CPC ..................................................... H01L 23/552
See application file for complete search history.

(56) References Cited

U.S. PATENT DOCUMENTS

| 6,221,694 | B1 * | 4/2001 | Bhatt | H01L 21/4803 |
| | | | | 257/E23.004 |
| 7,045,391 | B2 * | 5/2006 | Lin | H01L 23/49816 |
| | | | | 257/E23.069 |
| 8,178,963 | B2 * | 5/2012 | Yang | H01L 21/6835 |
| | | | | 257/678 |
| 8,178,964 | B2 * | 5/2012 | Yang | H01L 24/18 |
| | | | | 257/698 |
| 8,432,022 | B1 * | 4/2013 | Huemoeller | H01L 23/552 |
| | | | | 257/508 |
| 8,736,033 | B1 * | 5/2014 | Chuo | H01L 23/552 |
| | | | | 257/659 |
| 8,890,628 | B2 * | 11/2014 | Nair | H01L 25/16 |
| | | | | 257/416 |

(Continued)

FOREIGN PATENT DOCUMENTS

JP 2008-243966 A 10/2008
KR 10-1158213 B1 6/2012

(Continued)

*Primary Examiner* — Eugene Lee
(74) *Attorney, Agent, or Firm* — NSIP Law

(57) ABSTRACT

A semiconductor package includes a frame including a through-hole, an electronic component disposed in the through-hole, a redistribution portion disposed below the frame and the electronic component, a metal layer disposed on an inner surface of the frame, and a conductive layer disposed between the metal layer and the electronic component, and covering the frame and the electronic component.

11 Claims, 7 Drawing Sheets

(56) References Cited

U.S. PATENT DOCUMENTS

| | | | |
|---|---|---|---|
| 9,607,967 B1* | 3/2017 | Shih | H01L 25/0657 |
| 9,666,546 B1* | 5/2017 | Schneegans | H01L 24/06 |
| 2001/0010627 A1* | 8/2001 | Akagawa | H01L 23/3121 |
| | | | 361/761 |
| 2006/0145328 A1* | 7/2006 | Hsu | H01L 23/5389 |
| | | | 257/690 |
| 2010/0072588 A1* | 3/2010 | Yang | H01L 23/49816 |
| | | | 257/676 |
| 2010/0159647 A1* | 6/2010 | Ito | H01L 23/49822 |
| | | | 438/124 |
| 2010/0301474 A1* | 12/2010 | Yang | H01L 21/6835 |
| | | | 257/737 |
| 2014/0103543 A1* | 4/2014 | Nagai | H01L 24/17 |
| | | | 257/777 |
| 2015/0200182 A1* | 7/2015 | Wang | G06F 17/5077 |
| | | | 257/774 |
| 2017/0047308 A1* | 2/2017 | Ho | H01L 25/0652 |
| 2017/0110413 A1* | 4/2017 | Chen | H01L 21/3205 |

FOREIGN PATENT DOCUMENTS

| | | |
|---|---|---|
| KR | 10-2012-0077872 A | 7/2012 |
| KR | 10-2014-0043568 A | 4/2014 |

* cited by examiner

SEMICONDUCTOR PACKAGE, METHOD OF MANUFACTURING THE SAME, AND ELECTRONIC DEVICE MODULE

CROSS-REFERENCE TO RELATED APPLICATIONS

This application claims the benefit under 35 USC 119(a) of Korean Patent Application Nos. 10-2016-0117253 and 10-2017-0025308 filed on Sep. 12, 2016 and Feb. 27, 2017, respectively, in the Korean Intellectual Property Office, the entire disclosures of which are incorporated herein by reference for all purposes.

BACKGROUND

1. Field

The following description relates to a semiconductor package, a method of manufacturing a semiconductor package, and an electronic device module including a semiconductor package.

2. Description of Related Art

Recently, due to semiconductor packages being designed to be lightweight and compact, the dissipation of heat which may cause power loss when an electronic component is operated has become a significant issue. Moreover, heat generated by an electronic component may cause an electronic component and a semiconductor package to be degraded, thereby causing a problem in which device reliability is reduced and device performance characteristics are degraded.

In addition, due to the trend of miniaturization, electronic products have been reduced in size and a distance between various devices has therefore been reduced. Accordingly, the application of an EMI shielding method of the related art to electronic products of reduced size is problematic.

Therefore, the development of a structure for improving heat dissipation and EMI shielding performance is desired to solve the problems described above.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package includes a frame including a through-hole, an electronic component disposed in the through-hole, a redistribution portion disposed below the frame and the electronic component, a metal layer disposed on an inner surface of the frame, and a conductive layer disposed between the metal layer and the electronic component, and covering the frame and the electronic component.

The frame may include a core formed of an insulating material, and a conductor layer disposed on either one or both of an upper surface and a lower surface of the core.

The frame may further include a via configured to electrically connect the conductor layer to the redistribution portion, and the metal layer and the conductive layer may be connected to a ground electrode by the via.

The metal layer may include any one of copper (Cu), nickel (Ni), and an alloy containing any one of Cu and Ni.

The conductive layer may include any one of silver (Ag) epoxy, conductive epoxy, and a solder material.

The semiconductor package may further include: a bonding auxiliary layer disposed below the conductive layer and configured to assist the conductive layer in bonding.

The conductive layer may include a solder material, and the bonding auxiliary layer may include any one of tin (Sn), lead (Pb), silver (Ag), and an alloy containing any one of Sn, Pb and Ag.

A lower surface of the redistribution portion may include solder balls disposed therein.

An electronic device module may include: the semiconductor package of claim 1; and an electronic device mounted on a side of the semiconductor package.

An electronic device module may include: the semiconductor package of claim 1; and a package-on-package mounted on a side of the semiconductor package.

In another general aspect, a method to manufacture a semiconductor package includes: forming a metal layer on an inner surface of a frame; forming a via in a via hole disposed in the frame; disposing an electronic component in a through-hole disposed in the frame; forming a conductive layer between the electronic component and the metal layer, and covering the electronic component and the frame; forming a redistribution portion on lower surfaces of the frame and the electronic component; and forming solder balls on a lower surface of the redistribution portion.

The method may further include: bonding a carrier member to a lower surface of the frame, after the forming of the metal layer on the inner surface of the frame and the forming of the via in the via hole.

The metal layer may include any one of copper (Cu), nickel (Ni), and an alloy containing any one of Cu and Ni.

The metal layer and the conductive layer may be connected to a ground electrode by the via.

The conductive layer may include any one of silver (Ag) epoxy and conductive epoxy.

The method may further include: forming a bonding auxiliary layer on upper surfaces of the frame and the electronic component, an inner surface of the metal layer, and a side surface of the electronic component, before the forming of the conductive layer.

The conductive layer may include a solder material.

The bonding auxiliary layer may include any one of tin (Sn), lead (Pb), silver (Ag), and an alloy containing any one of Sn, Pb and Ag.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
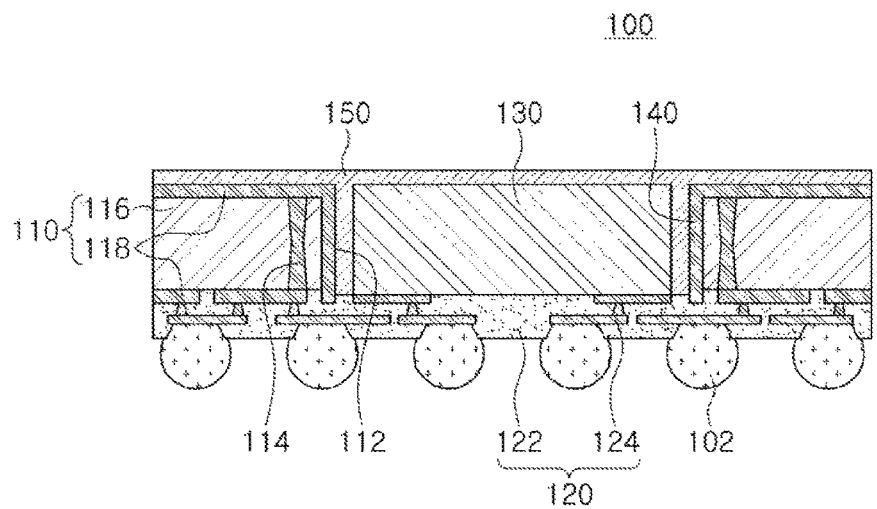
FIG. 1 is a schematic cross sectional view illustrating a semiconductor package, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Examples are described below in further detail with reference to the accompanying drawings.

Referring to FIG. 1, a semiconductor package 100, according to an example, includes a frame 110, a redistribution portion 120, an electronic component 130, a metal layer 140, and a conductive layer 150.

A through-hole 112 is disposed in the frame 110. The electronic component 130 is inserted and disposed in the through-hole 112. In other words, for example, the frame 110 is disposed to surround the electronic component 130, and the frame 110 has a plate shape in which the electronic component 130 is disposed in the through-hole 112.

Vias 114 are formed in the frame 110, and are configured to connect the conductive layer 150 to a ground electrode, which will be described later, by way of example.

In addition, the frame 110 includes a core 116, and a conductor layer 118 formed on an upper surface and a lower surface of the core 116.

The core 116 is formed of an insulating material, for example, a thermosetting resin such as an epoxy resin, a thermoplastic resin such as polyimide, or a resin in which a reinforcing material such as a glass fiber or an inorganic filler is impregnated, for example, prepreg, an Ajinomoto build-up film (ABF), FR-4, or a bismaleimide triazine (BT) resin. However, the material of the core 116 is not limited to the foregoing examples.

A metal having excellent rigidity and thermal conductivity is disposed inside the core 116. The metal may be a Fe—Ni-based alloy, and Cu plating may be formed on a surface of the Fe—Ni-based alloy. In addition, further materials such as glass, ceramic, or plastic may be disposed inside the core.

The conductor layer 118 includes a material having excellent conductivity. For example, the conductor layer 118 includes any one or any mixture of any two or more of silver (Ag), palladium (Pd), aluminum (Al), nickel (Ni), titanium (Ti), gold (Au), copper (Cu), and platinum (Pt). However, other materials having excellent conductivity may be used.

The conductor layer 118 is formed by a known method, for example, electrolytic copper plating or electroless copper plating. In more detail, the conductor layer may be formed in a method such as chemical vapor deposition (CVD), physical vapor deposition (PVD), sputtering, a subtractive method, an additive method, a semi-additive process (SAP), or a modified semi-additive process (MSAP), but is not limited to being formed by the foregoing methods.

The redistribution portion 120 is formed below the frame 110, and the electronic component 130 is mounted on the redistribution portion 120. By way of example, the redistribution portion 120 includes an insulating layer 122 and a wiring layer 124. In addition, a solder ball 102 is formed in the wiring layer 124 and is exposed at a lower portion of the redistribution portion 120.

The wiring layer 124 is electrically connected to the via 114. The wiring layer 124 is also electrically connected to the conductor layer 118 and the electronic component 130, which will be described later.

The electronic component 130 is installed on the redistribution portion 120 such that the electronic component 130 is inserted and disposed in the through-hole 112. A connection electrode (not shown) connected to the wiring layer 124 may be exposed to a lower surface of the electronic component 130.

By way of example, the electronic component 130 is an integrated circuit (IC) chip, but is not limited thereto. The electronic component 130 may be any one of various chips such as an image sensor and a memory chip.

The metal layer 140 is formed on an inner surface of the frame 110. In other words, the metal layer 140 is formed on the inner surface of the frame 110 forming the through-hole 112. The metal layer 140 is formed of copper (Cu) or nickel (Ni) or an alloy containing copper (Cu) or nickel (Ni).

The metal layer 140 may be electrically connected to a ground electrode (not shown).

As described above, since the metal layer 140 is formed on the inner surface of the frame 110, heat generated by the electronic component 130 is transferred to the redistribution portion 120 and the conductor layer 118 through the metal layer 140, thereby improving heat dissipation efficiency.

Furthermore, the metal layer 140 is configured to be electrically connected to a ground electrode, thereby improving electromagnetic interference (EMI) shielding performance.

The conductive layer 150 covers an upper surface of the frame 110 and an upper surface of the electronic component 130.

As described above, the conductive layer 150 performs EMI shielding and heat dissipation functions. In other words, the conductive layer 150 covers the upper surface of the electronic component 130, thereby performing EMI shielding and heat dissipation functions.

The conductive layer 150 may be formed of silver (Ag) epoxy or conductive epoxy. However, other materials may be used for the conductive layer 150.

As described above, since the conductive layer 150 covers the upper surface of the frame 110 and the upper surface of the electronic component 130, EMI shielding properties are improved as compared to a configuration in which the conductive layer 150 is not provided. For example, when the conductive layer 150 is provided, EMI shielding properties are improved in comparison to an example in which an epoxy molding compound (EMC) molding layer is provided.

In addition, in the example illustrated in FIG. 1, the conductive layer 150 is formed in a space formed between a side surface of the electronic component 130 and an inner surface of the metal layer 140. As described above, the conductive layer 150 fixes the electronic component 130 in the through-hole 112.

Furthermore, as since the conductive layer 150 is formed in the space formed between the side surface of the electronic component 130 and the inner surface of the metal layer 140, EMI shielding properties are improved. In addition, since the conductive layer 150 is formed in the space formed between the side surface of the electronic component 130 and the inner surface of the metal layer 140, heat transfer to the metal layer 140 from the conductive layer 150 may be more quickly carried out, thereby improving heat dissipation performance.

As described above, due to the conductive layer 150, EMI shielding properties and heat dissipation performance may be improved.

FIGS. 2 through 9 are views illustrating a method of manufacturing the semiconductor package 100, according to an example.

Figure 2:
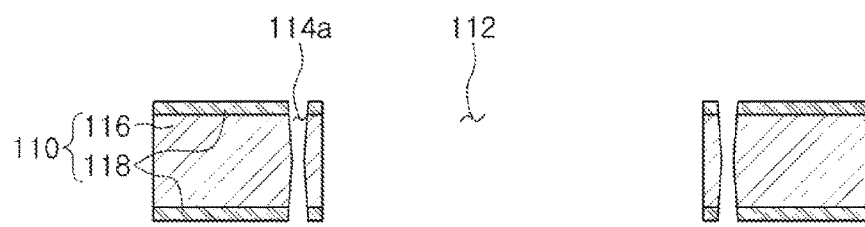
FIGS. 2 through 9 are views illustrating an example of method of manufacturing the semiconductor package of FIG. 1.

First, as illustrated in FIG. 2, the through-hole 112 and a via hole 114a are formed in the frame 110. The via hole 114a may be formed as a plurality of via holes formed around the through-hole 112.

The frame 110 includes the core 116 formed of an insulating material, and the conductor layer 118 formed on the upper surface and the lower surface of the core 116.

Figure 3:
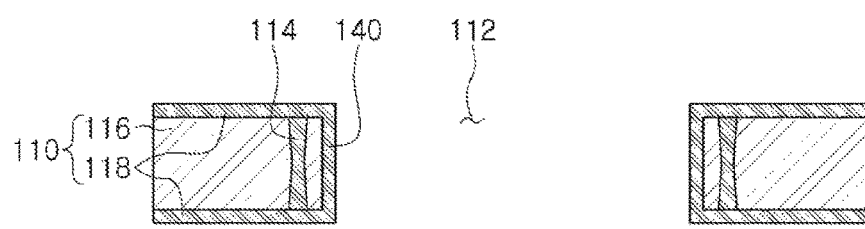

Hereinafter, as illustrated in FIG. 3, the metal layer 140 is formed on the inner surface of the frame 110. The metal layer 140 may be formed of copper (Cu) or nickel (Ni), or an alloy containing copper (Cu) or nickel (Ni).

The via hole 114a is filled with a conductive material to form the via 114.

Figure 4:
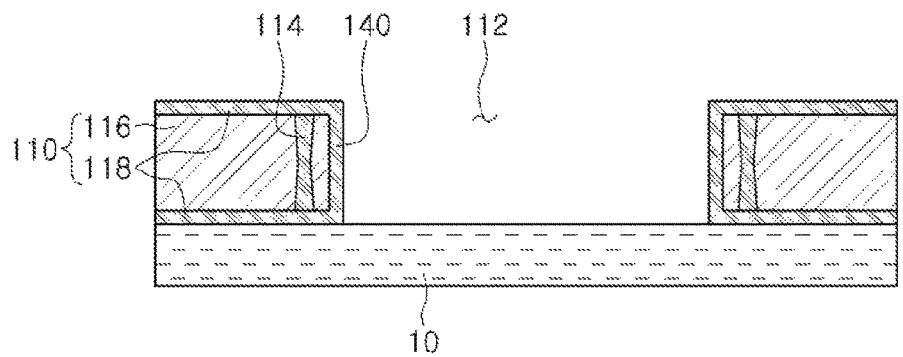

Thereafter, as illustrated in FIG. 4, a first carrier 10 is attached to a lower surface of the frame 110. The first carrier 10, which is configured to be temporarily attached for attachment of the electronic component 130 and formation of the conductive layer 150, will be removed later.

Figure 5:
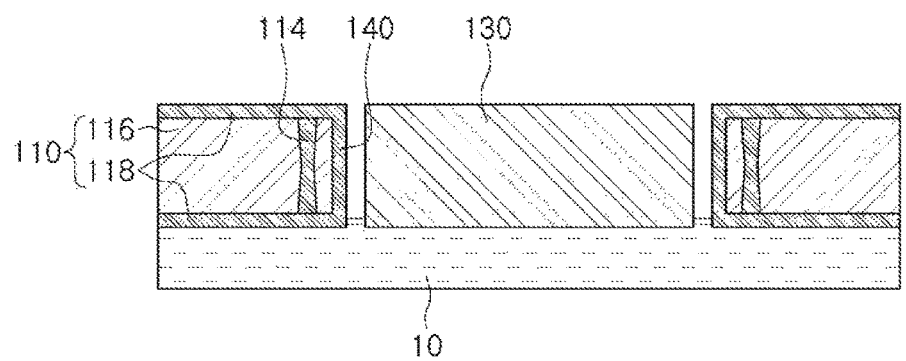

When attachment of the first carrier 10 is complete, as illustrated in FIG. 5, the electronic component 130 is attached to the first carrier 10. The electronic component 130 is inserted and disposed in the through-hole 112. In addition, the electronic component 130 is installed on the first carrier 10 such that the electronic component 130 is spaced apart from the metal layer 140, which is formed on the inner surface of the frame 110, by a predetermined distance.

In the above description, an example in which the metal layer 140 is formed before the electronic component 130 is installed is illustrated by way of example, but the method is not limited to this example. Alternatively, the metal layer 140 may be formed while the electronic component 130 is formed on the first carrier 10.

Figure 6:
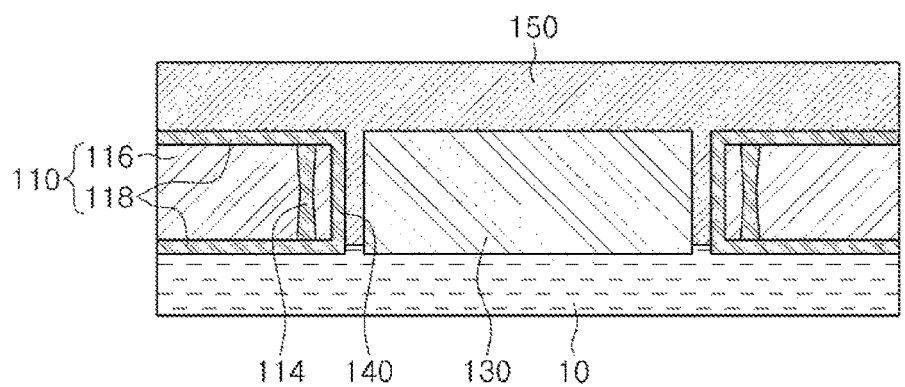

Thereafter, as illustrated in FIG. 6, the conductive layer 150 is formed in the space formed between the side surface of the electronic component 130 and the inner surface of the metal layer 140. In addition, the conductive layer 150 is formed to cover the upper surface of the electronic component 130 and the upper surface of the frame 110.

As described above, the conductive layer 150 is formed in the space formed between the side surface of the electronic component 130 and the inner surface of the metal layer 140, thereby fixing the electronic component 130 in the through-hole 112.

The conductive layer 150 may be formed of silver (Ag) epoxy or conductive epoxy.

Figure 7:
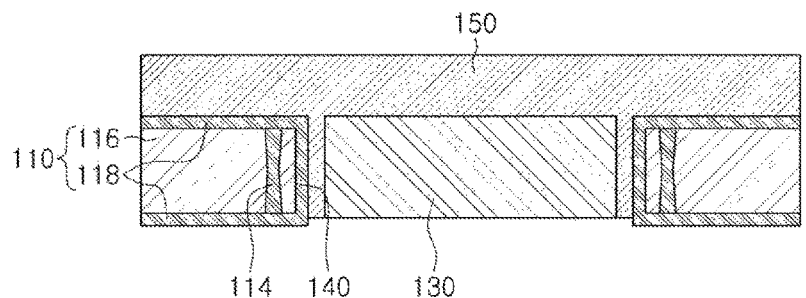

Thereafter, as illustrated in FIG. 7, the first carrier 10 is removed.

Figure 8:
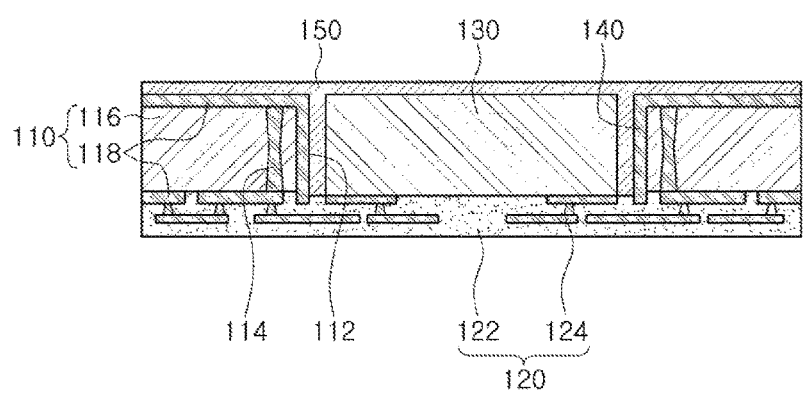

Next, as illustrated in FIG. 8, the redistribution portion 120 is formed below the frame 110. The redistribution portion 120 includes the insulating layer 122 and the wiring layer 124, and the wiring layer 124 may be electrically connected to a ground electrode.

The electronic component 130 is also electrically connected to the wiring layer 124.

Figure 9:
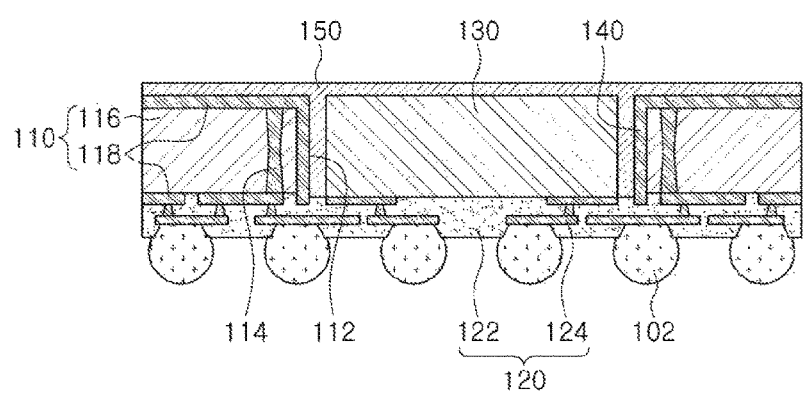

When formation of the redistribution portion 120 is complete, as illustrated in FIG. 9, the solder ball 102 is formed in the lower surface of the redistribution portion 120.

As described above, the formation of the conductive layer 150 improves EMI shielding performance and heat dissipation performance.

Furthermore, the formation of the redistribution portion 120 further fixes electronic component 130.

Hereinafter, a semiconductor package 200, according to another example, will be described with reference to the drawings. However, in the interest of conciseness, the description of the same components as those described above will be omitted, with the understanding that the corresponding description above applies.

Figure 10:
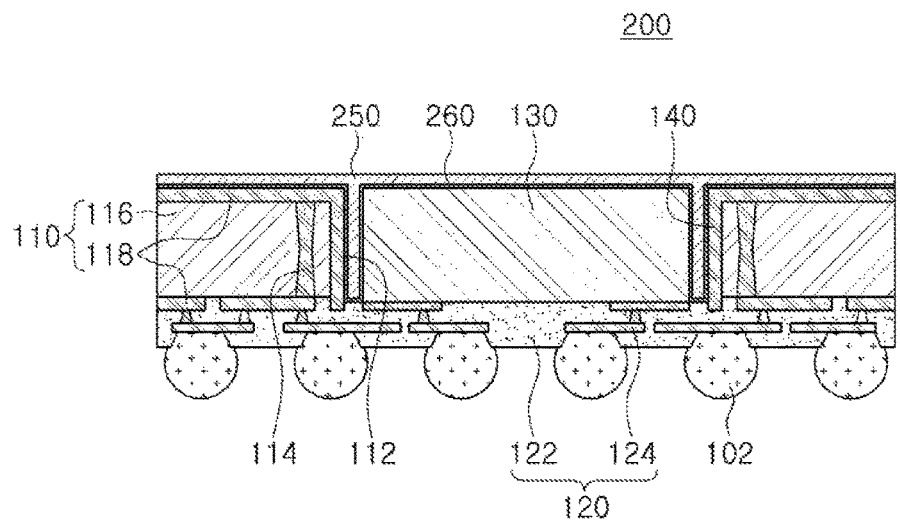
FIG. 10 is a schematic cross sectional view illustrating a semiconductor package, according to another example.

FIG. 10 is a schematic cross sectional view illustrating the semiconductor package 200, according to an example. Referring to FIG. 10, the semiconductor package 200 includes the frame 110, the redistribution portion 120, the electronic component 130, the metal layer 140, a conductive layer 250, and a bonding auxiliary layer 260, for example.

The description of the frame 110, the redistribution portion 120, the electronic component 130, and the metal layer 140, which are the same components as those included in the semiconductor package 100 according to the example of FIG. 1, will be omitted with the understanding that the description provided above applies.

The conductive layer 250 covers the upper surface of the frame 110 and the upper surface of the electronic component 130.

As described above with respect the conductive layer 150, the conductive layer 250 performs EMI shielding and heat dissipation functions. In other words, the conductive layer 250 covers the upper surface of the electronic component 130, thereby performing EMI shielding and heat dissipation functions.

The conductive layer 250 may be formed of a solder material. However, other conductive materials may be used.

Since the conductive layer 250 covers the upper surface of the frame 110 and the upper surface of the electronic component 130, EMI shielding properties are improved as compared to an example in which the conductive layer 250 is not provided. In other words, as compared to an example in which an EMC molding layer is provided, when the conductive layer 250 is provided, EMI shielding properties are improved. Furthermore, heat dissipation performance is improved.

In addition, the conductive layer 250 is formed in a space formed between the side surface of the electronic component 130 and the inner surface of the metal layer 140. Therefore, as described above, the conductive layer 250 fixes the electronic component 130 in the through-hole 112.

Furthermore, since the conductive layer 250 is formed in the space formed between the side surface of the electronic component 130 and the inner surface of the metal layer 140, EMI shielding are improved.

In addition, because the conductive layer 250 is formed in the space formed between the side surface of the electronic component 130 and the inner surface of the metal layer 140, heat transfer to the metal layer 140 from the conductive layer 250 may be more quickly carried out, thereby improving heat dissipation performance.

The bonding auxiliary layer 260 is disposed below the conductive layer 250 to more easily bond the conductive layer 250 to the conductor layer 118, the electronic component 130, and the metal layer 140. In other words, the bonding auxiliary layer 260 is formed on upper surfaces of the frame 110 and the electronic component 130 in addition to side surfaces of the metal layer 140 and the electronic component 130, before the conductive layer 250 is formed.

By way of example, the bonding auxiliary layer 260 is formed of a metal material that is easily bonded to the conductive layer 250, which is formed of the solder material. For example, the bonding auxiliary layer 260 is formed of tin (Sn), lead (Pb), or silver (Ag) or an alloy containing tin (Sn), lead (Pb), or silver (Ag).

As described above, through the bonding auxiliary layer 260, formation of the conductive layer 250 may be easily performed.

Furthermore, in the same manner as the semiconductor package 100 according to the example FIG. 1, through the conductive layer 250, EMI shielding properties and a heat dissipation performance are improved.

FIGS. 11 through 15 are views illustrating a method of manufacturing the semiconductor package 200, according to an example. In the following description of the method of manufacturing the semiconductor package 200, operations that are the same as those discussed above with respect to FIGS. 2 through 9 will be omitted, with the understanding that such operations also apply to FIGS. 2 through 9.

First, in the method of manufacturing the semiconductor package 200, the same process as the process illustrated in FIGS. 2 through 4 is performed.

Figure 11:
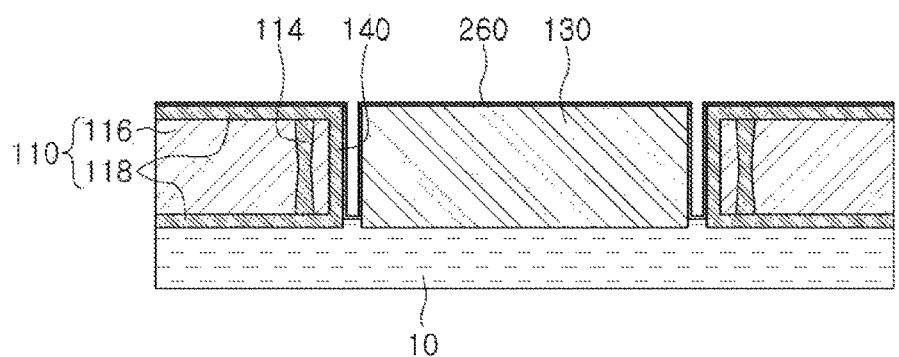
FIGS. 11 through 15 are views illustrating an example of a method of manufacturing the semiconductor package of FIG. 10.

Thereafter, as illustrated in FIG. 11, the bonding auxiliary layer 260 is formed. The bonding auxiliary layer 260 is formed to cover the upper surface of a frame 110 and the upper surface of an electronic component 130. The bonding auxiliary layer 260 is also formed on side surfaces of the metal layer 140 and the electronic component 130.

The bonding auxiliary layer 260 allows the conductive layer 250 to be more easily bonded when the conductive layer 250 is thereafter formed.

For example, the bonding auxiliary layer 260 is formed of tin (Sn), lead (Pb), or silver (Ag), or an alloy containing tin (Sn), lead (Pb), or silver (Ag).

Figure 12:
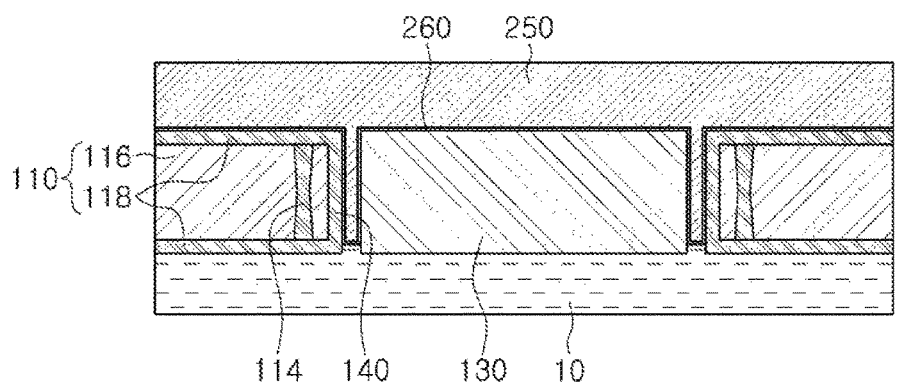

Thereafter, as illustrated in FIG. 12, the conductive layer 250 is formed on the bonding auxiliary layer 260. The conductive layer 250 may be formed of a solder material.

As described above, since the conductive layer 250 is formed on the bonding auxiliary layer 260, even when the conductive layer 250 is formed of a solder material, stacking of the conductive layer 250 may be easily performed.

Figure 13:
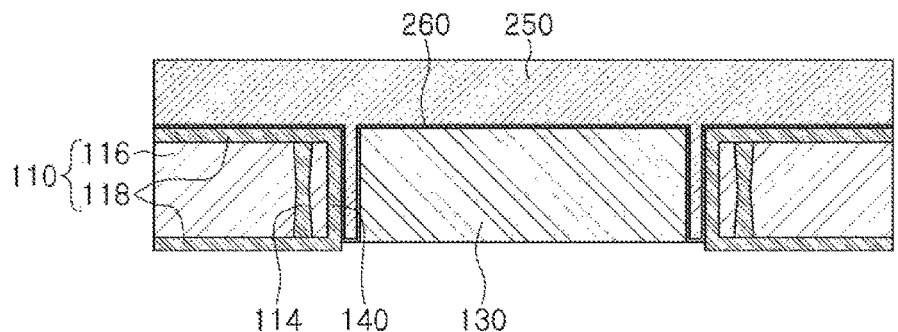

Thereafter, as illustrated in FIG. 13, the carrier 10 is removed after the conductive layer 250 is formed.

Figure 14:
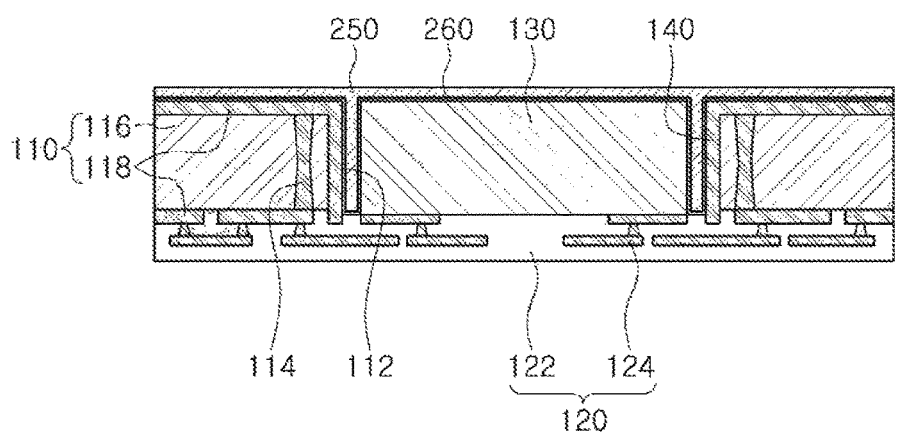

Thereafter, as illustrated in FIG. 14, the redistribution portion 120 is formed below the frame 110. The redistribution portion 120 includes the insulating layer 122 and the wiring layer 124, and the wiring layer 124 may be electrically connected to a ground electrode.

The electronic component 130 is also electrically connected to the wiring layer 124.

Figure 15:
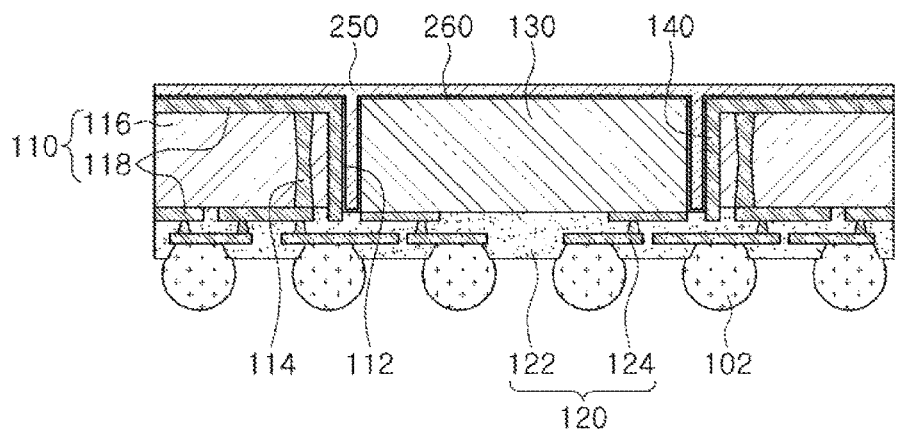

When formation of the redistribution portion 120 is complete, as illustrated in FIG. 15, the solder ball 102 is formed in the lower surface of the redistribution portion 120.

As described above, since the bonding auxiliary layer 260 is formed, formation of the conductive layer 250, which is formed of a solder material, may be easily performed.

In addition, the formation of the conductive layer 250 improves EMI shielding performance and heat dissipation performance.

Furthermore, the electronic component 130 is further fixed by the redistribution portion 120.

Figure 16:
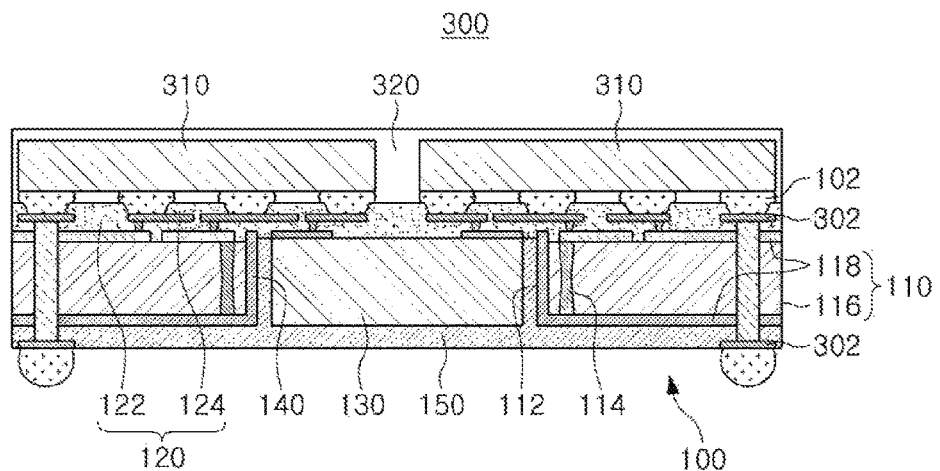
FIG. 16 is a schematic cross sectional view illustrating an electronic device module, according to an example.

FIG. 16 is a schematic cross sectional view illustrating an electronic device module 300, according to an example. Referring to FIG. 16, in the electronic device module 300, at least one electronic device 310 is mounted on the semiconductor package 100 illustrated in FIG. 1, which is described above. In addition, the electronic device 310 is sealed by a sealing portion 320.

As shown in FIG. 16, a connection pad 302 is provided on both sides (e.g., top and bottom sides) of the semiconductor package 100. Thus, a main substrate (not shown) may be mounted on a first side of among both sides, and the electronic device 310, which has been separately manufactured, is mounted on a second side among both sides.

In addition, the electronic device 310 may be an active device or a passive device, and the sealing portion 320 may be formed of EMC.

Also, as shown in FIG. 16, in the semiconductor package 100, connection pads 302 are formed along substantially the entirety of the second side. In this example, multiple electronic device 310 are mounted on the semiconductor package 100, such that a degree of integration is increased.

Although the semiconductor package 100 is described in the example of FIG. 16, other configurations are possible. For example, the semiconductor package 200 of FIG. 10 may be used in the electronic device module 300.

Figure 17:
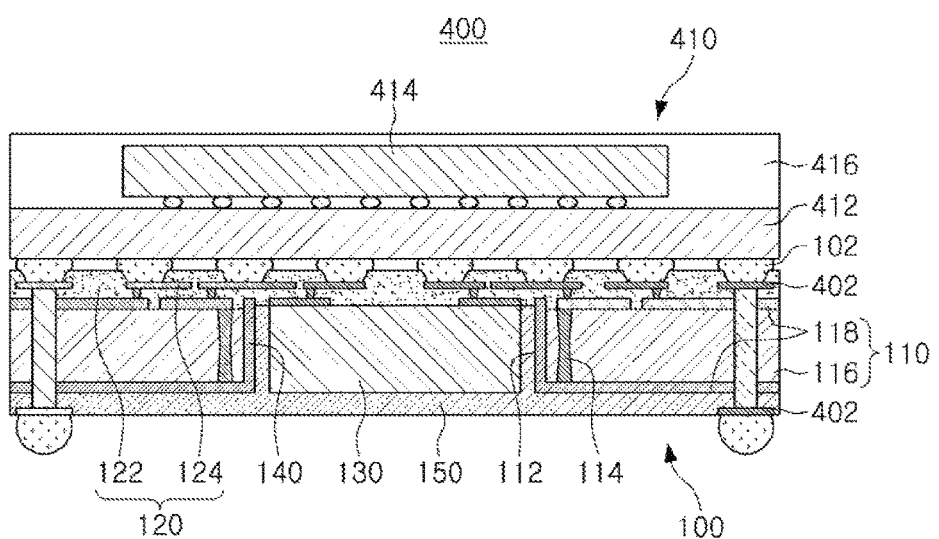
FIG. 17 is a schematic cross sectional view illustrating an electronic device module, according to another example.

FIG. 17 is a schematic cross sectional view illustrating an electronic device module 400, according to another example. Referring to FIG. 17, in the electronic device module 400, a package-on-package (PoP) 410 is mounted on the semiconductor package 100 illustrated in FIG. 1, described above.

In addition, in the semiconductor package 100, a connection pad 402 is provided on each of both sides (e.g., top and bottom sides) of the semiconductor package 100. Thus, a main substrate (not shown) may be mounted on a first side among both sides, and the PoP 410, which has been separately manufactured, is mounted on a second side among both sides.

By way of example, in the PoP 410, an electronic device 414 is mounted on a substrate for a package 412, and the electronic device 414 is sealed by a sealing portion 416. However, the PoP 410 is not limited to this example, and all components to be mounted, such as a heat radiating member (not shown), may be mounted on the second side of the semiconductor package 100.

In addition, in the semiconductor package 100, connection pads 402 are formed along substantially the entirety of the second side. Thus, a package having a large number of I/O terminals may be mounted on the second side. Thus, bonding reliability with the PoP 410 to be mounted on the second side is improved.

Although the semiconductor package 100 is described in the example of FIG. 17, other configurations are possible. For example, the semiconductor package 200 of FIG. 10 may be used.

Figure 18:
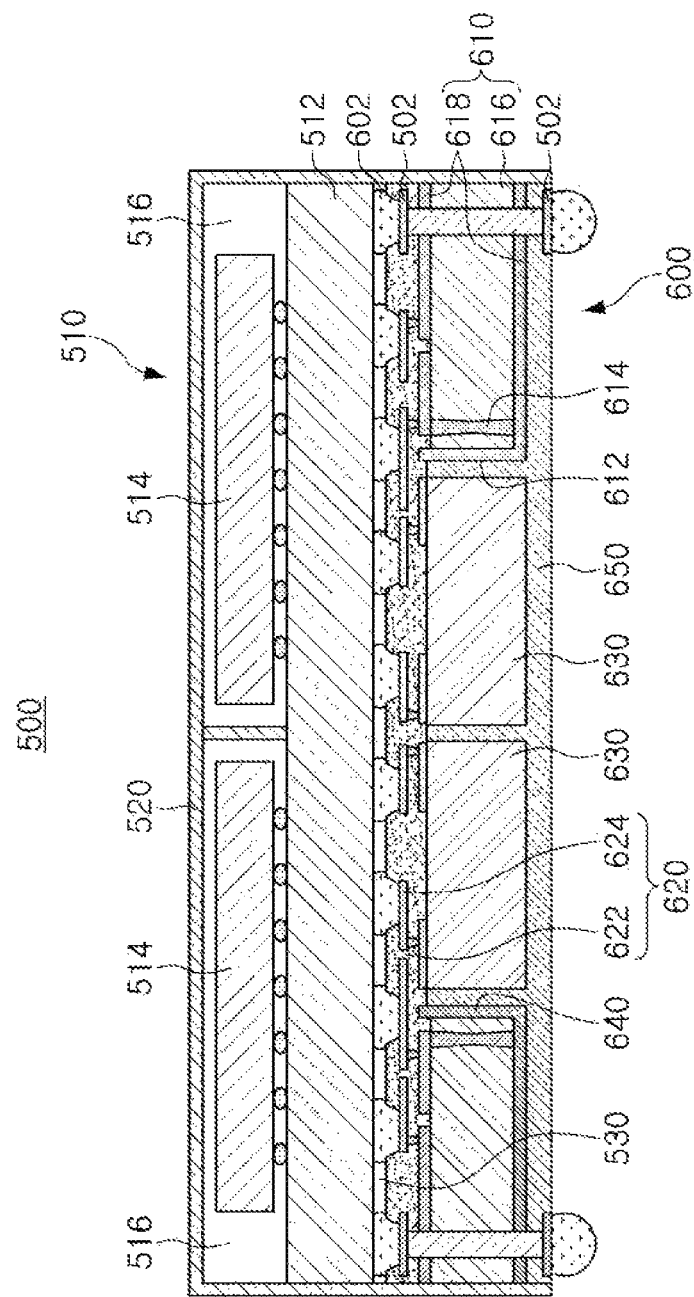
FIG. 18 is a schematic cross sectional view illustrating an electronic device module, according to another example.

FIG. 18 is a schematic cross sectional view illustrating an electronic device module 500, according to another example. Referring to FIG. 18, in the electronic device module 500, a package-on-package (PoP) 510 is mounted on a semiconductor package 600.

The semiconductor package 600 includes electronic components 630 inside. An electronic component 630 may include a power amplifier or a filter, or an IC, and may be embedded in the form of a bare die. The semiconductor package 600 may have the same configuration as the semiconductor package 100 according to the example of FIG. 1, except that the electronic components 630 are mounted in the semiconductor package 600.

In the PoP 510, electronic devices 514 are mounted on a substrate for a package 512, and each electronic device 514 is sealed by a sealing portion 516. However, the PoP 510 is not limited to this example.

In addition, a cap member 520 is disposed on a surface of the electronic device module 500.

The cap member 520 is configured to shield electromagnetic waves. Thus, the cap member 520 is formed along surfaces of the semiconductor package 600 and the PoP 510.

A gap between the semiconductor package 600 and the package-on-package 510 is filled with an insulating material 530.

The cap member 520 is not limited to the configuration described above, and may be formed only on a surface of one of the semiconductor package 600 and the PoP 510 as needed. In addition, the cap member 520 is interposed between the electronic devices 514 provided in the PoP 510 to block mutual interference between the electronic devices 514.

As described above, the electronic component 630 in the form of a bare die is embedded inside the electronic device module 600, and a connection terminal 502 is disposed on both sides (e.g., top and bottom sides) of the semiconductor package 600. Thus, while a size of an electronic device module 500 is significantly reduced, and the electronic device module 500 is used for a structure of a PoP.

In addition, as heat generated by an electronic component 630 is effectively discharged through a block conductor, a temperature of the electronic device module 500 during an operation of the electronic devices 514 may be prevented from increasing.

According to examples set forth above, heat dissipation properties and EMI shielding performance in semiconductor packages and electronic device modules are improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
   a frame comprising a through-hole, a core formed of an insulating material, and a conductor layer disposed on an upper surface of the core;
   an electronic component disposed in the through-hole;
   a redistribution portion disposed below the frame and the electronic component;
   a metal layer disposed on an inner surface of the frame; and
   a conductive layer disposed between the metal layer and the electronic component, and covering an upper surface of the conductor layer and an upper surface of the electronic component.

2. The semiconductor package of claim 1, wherein the conductor layer is further disposed on a lower surface of the core.

3. The semiconductor package of claim 2, wherein the frame further comprises a via configured to electrically connect the conductor layer to the redistribution portion.

4. The semiconductor package of claim 1, wherein the metal layer comprises any one of copper (Cu), nickel (Ni), and an alloy containing any one of Cu and Ni.

5. The semiconductor package of claim 1, wherein the conductive layer comprises any one of silver (Ag) epoxy, conductive epoxy, and a solder material.

6. The semiconductor package of claim 1, further comprising:
a bonding auxiliary layer disposed below the conductive layer and configured to assist the conductive layer in bonding.

7. The semiconductor package of claim 6, wherein
the conductive layer comprises a solder material, and
the bonding auxiliary layer comprises any one of tin (Sn), lead (Pb), silver (Ag), and an alloy containing any one of Sn, Pb and Ag.

8. The semiconductor package of claim 1, wherein a lower surface of the redistribution portion comprises solder balls disposed therein.

9. An electronic device module, comprising:
the semiconductor package of claim 1; and
an electronic device mounted on a side of the semiconductor package.

10. An electronic device module, comprising:
the semiconductor package of claim 1; and
a package-on-package mounted on a side of the semiconductor package.

11. The semiconductor package of claim 1, wherein the conductive layer substantially entirely covers the upper surface of the electronic component.

* * * * *